United States Patent
Krvavac et al.

(10) Patent No.: US 8,159,296 B2
(45) Date of Patent: Apr. 17, 2012

(54) METHOD AND APPARATUS FOR A POWER SUPPLY MODULATOR LINEARIZER

(75) Inventors: Enver Krvavac, Lake Zurich, IL (US); Jeffrey A. Frei, Hawthorn Woods, IL (US); James E. Mitzlaff, Arlington Heights, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 16 days.

(21) Appl. No.: 12/649,453

(22) Filed: Dec. 30, 2009

(65) Prior Publication Data
US 2011/0156814 A1 Jun. 30, 2011

(51) Int. Cl.
*H03F 1/26* (2006.01)
*H03F 3/20* (2006.01)
(52) U.S. Cl. ........................................ 330/149; 330/127
(58) Field of Classification Search .................. 330/127, 330/149, 297
See application file for complete search history.

(56) References Cited

U.S. PATENT DOCUMENTS

| 5,175,877 | A |   | 12/1992 | Streeter |
|---|---|---|---|---|
| 5,861,777 | A | * | 1/1999 | Sigmon et al. ................. 330/136 |
| 6,256,482 | B1 |   | 7/2001 | Raab |
| 6,735,419 | B2 |   | 5/2004 | Mitzlaff |
| 6,759,902 | B2 | * | 7/2004 | Kossor .......................... 330/136 |
| 2008/0081572 | A1 |   | 4/2008 | Rofougaran |

* cited by examiner

*Primary Examiner* — Robert Pascal
*Assistant Examiner* — Khiem Nguyen

(57) ABSTRACT

A method and apparatus for a power amplifier module is described. The module includes a power amplifier and a power supply modulator coupled to the power amplifier. In addition, the module includes an inverter coupled between the power amplifier and the power supply modulator. The inverter provides a predistorted signal to the power amplifier to cancel distortion in the power amplifier provided by the power supply modulator. In addition, the module can include a driver coupled between the power amplifier and the inverter wherein the driver supplies the predistorted signal to the power amplifier.

17 Claims, 4 Drawing Sheets

METHOD AND APPARATUS FOR A POWER SUPPLY MODULATOR LINEARIZER

FIELD OF THE INVENTION

The present invention relates generally to power amplifiers and, more particularly to an apparatus and method for a power supply modulator linearizer to provide a predistored signal to a power amplifier to cancel phase and gain changes caused by a power supply modulator.

BACKGROUND

For greatest efficiency, various radio frequency (RF) systems attempt to run power amplifiers at or near their saturation levels, in which the actual output power of the power amplifier is just below its maximum power output level. This power output level is generally related to the supply voltage to the power amplifier, such that a greater supply voltage will produce a correspondingly greater saturated output power from the amplifier. In various prior art power amplifiers, the supply voltage to the power amplifier is fixed. Given a typical usage situation in which actual power output from the amplifier may vary by a range up to several orders of magnitude, use of a fixed supply voltage is highly inefficient as average output power can be an order of magnitude below its maximum and the power amplifier is not maintained at our near its saturation levels.

Various techniques have evolved to vary the supply voltage to maintain the power amplifier at or near saturation. One such technique is using a power supply modulator (PSM) that varies or modulates the supply voltage to the power amplifier to maintain the amplifier at or near saturation while the input signal varies over time. For PSM, the supply voltage of the amplifier tracks input signal variations by typically using a signal detector in conjunction with tracking power supply. PSM, however, introduces nonlinearities in the output signal of the power amplifier, such as gain and phase distortions. While power amplifiers comprised of laterally diffused MOSFET (LDMOS) circuitry have good linearity with respect to input power, LDMOS power amplifiers have variations in gain and phase as a function of supply voltage. When PSM techniques are utilized for amplification efficiency, these nonlinearities cause spectral regrowth in QAM and OFDM modulation systems.

Without use of PSM, there can be less than 5° negative phase variation over a 0-250 mW input power range. Adding PSM adds 15° positive phase variation, which results in a net 10° phase variation over the power range. Experience has shown that the nonlinearities caused without PSM can be reduced to acceptable levels, but such is not the case if the phase variation is 10° or more. Thus, there is a need to reduce the phase variation in PSM power amplifiers.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
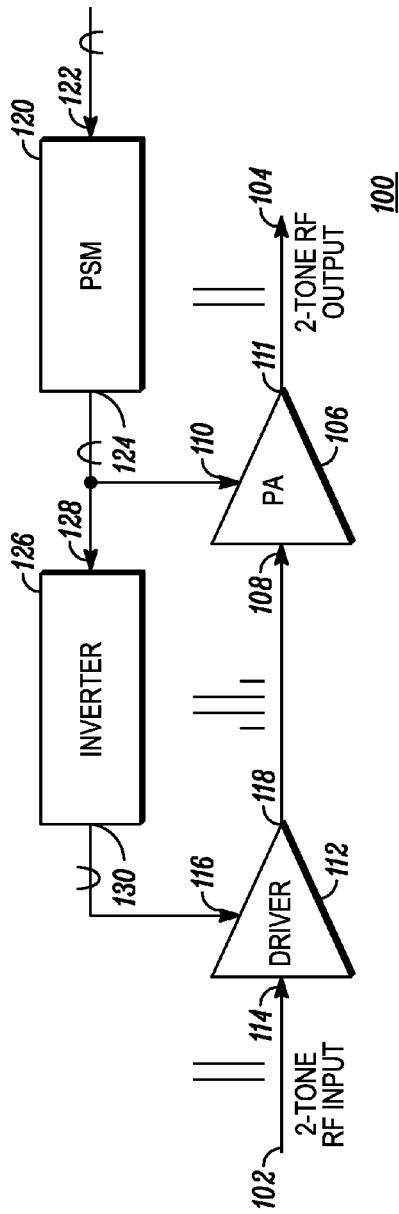
FIG. 1 is an example of a power amplifier module in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to power supply modulator linearizer. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of the power supply modulator linearizer described herein. The non-processor circuits may include, but are not limited to, a radio receiver, a radio transmitter, signal drivers, clock circuits, power source circuits, and user input devices. As such, these functions may be interpreted as steps of a method to perform power supply modulation linearization. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The present invention is directed to a power amplifier module and a method of using the power amplifier. The module includes a power amplifier and a power supply modulator coupled to the power amplifier. In addition, the module includes an inverter coupled between the power amplifier and the power supply modulator. The inverter provides a predistorted signal to the power amplifier to cancel distortion in the power amplifier provided by the power supply modulator. In addition, the module can include a driver coupled between the power amplifier and the inverter wherein the driver supplies the predistorted signal to the power amplifier.

The power amplifier module uses a radio frequency signal provided to the driver as an input signal. Moreover, the power supply modulator provides a modulated supply to the power amplifier and the inverter. A supply envelope is input into the power supply modulator so that the power supply modulator provides the modulated supply to the power amplifier and the inverter. As is understood by the description, the predistorted signal cancels the phase and gain caused by the modulated supply to the power amplifier.

In an embodiment, the power amplifier, the inverter and the driver are supplied on an integrated circuit chip. The integrated circuit chip can be of any known variety including CMOS chips, LDMOS chips, etc. In an alternative embodiment, the power amplifier and the inverter are supplied on a first integrated circuit chip and the driver is supplied on a second integrated circuit chip.

The module of the present invention performs a method of providing a radio frequency signal to a power amplifier and providing a modulated supply to power amplifier. The module also performs inverting the modulated supply to provide a predistorted signal and providing the predistorted signal to the power amplifier to cancel distortion in the power amplifier provided by the power supply modulator. In an embodiment, the radio frequency signal and the inverted modulated supply is supplied to a driver so that the driver supplies the predistorted signal to the power amplifier and the power supply modulator supplying the modulated supply to the power amplifier and the inverter. As is understood from the description, the module is canceling phase and gain signals caused by the modulated supply to the power amplifier.

As is understood by this description, one method to overcome the gain and phase introduced by the PSM is to incorporate a small voltage regulator to vary the driver stage supply voltage in a manner opposite to the change in the final stage supply voltage. When the power amplifier and a driver have the same gain and phase variation based on the supply voltage, an opposing supply voltage variation on the two stages should cancel the PSM induced nonlinearities.

Turning to FIG. 1, there is shown an embodiment of a power amplifier module 100 that uses the opposing supply voltage variation to cancel the PSM induced nonlinearities caused by power supply modulation. The power amplifier module 100 has an input 102 that can receive an RF signal. The power amplifier module 100 also has an output 104 that outputs an amplified RF signal from the module 100. As seen, the module 100 includes a power amplifier (PA) 106 that includes a first PA input 108, a second PA input 110 and a PA output 111. The PA output 111 corresponds to the output 104 of the module. The module also includes a driver 112 that includes a first driver input 114, a second driver input 116 and a driver output 118. The first driver input 114 corresponds to the input 102 of the module 100. A power supply modulator 120 is provided and has a PSM input 122 and a PSM output 124. In addition, an inverter 126 is provided and has an inverter input 128 and an inverter output 130.

As seen in FIG. 1, the power amplifier 106 is coupled to the driver 112 by coupling the driver output 118 to the first PA input 108. In addition, the power amplifier is coupled to the power supply modulator 120 by coupling the PSM output 124 to the second PA input 110. The inverter 126 is coupled between the power supply modulator 120 and the driver 112 by coupling the PSM output 124 to the inverter input 128 and the inverter output 130 to the second driver input 116.

An input signal, which can be a 2-tone RF input, can by supplied to the module at input 102 and driver input 114. An appropriate power supply envelope is supplied to PSM input 122 of the power supply modulator 120 so that the power amplifier operates at near saturation. The power supply modulator 120 outputs a modulated supply that is supplied to both the power amplifier 106 and the inverter 126. The power supply modulator 120 can improve the efficiency of the module 100, but adds distortion due to phase and gain changes caused by the varying supply voltage provided by the signal envelope. This distortion can be reduced by applying an inverse of the supply envelope to the driver so that a predistorted signal is also provided to the power amplifier 106. Therefore, the inverter 126 inverts the modulated supply and supplies an inverse modulated power supply to the driver 112. As the driver 112 has the inverse modulated supply and the RF input signal as inputs, the driver provides a predistorted RF driver signal to the power amplifier 106. The power amplifier has both the modulated supply and the predistored RF driver signal, which includes the effects of the inverse modulated supply, so that the distortions caused by the modulated supply are canceled by the predistored RF driver signal.

One of the advantages of the power amplifier module 100 described is that it is possible to provide the inverter 126 on a single integrated circuit, which can be an LDMOS circuit, with the driver 112 and the power amplifier 106. Since the driver and the final stage power amplifier will have the same gain and phase, the inverter will cancel the power supply modulator nonlinearities.

Figure 2:
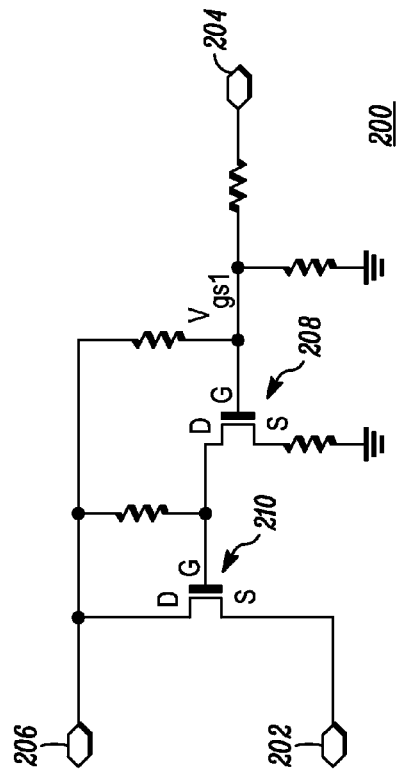
FIG. 2 is an illustration of an inverter circuit used in accordance with some embodiments of the invention.

FIG. 2 illustrates an embodiment of the inverter circuit 200 to be used on the single IC. The inverter circuit 200 includes a first port 202, a second port 204 and a third port 206. In addition, the inverter circuit 200 includes first FET 208 and second FET 210 as well as various circuit components such as resistors that are appropriately adjusted to cancel the nonlinearities created by the circuit. First port 202 is connected to the driver 112 so that the inverted supply is provided and supplied to the driver. Second port 204 is connected to power supply modulator so that the inverter receives the modulated supply and therefore invert that supply to be supplied to the driver 112. The third port 206 is connected to the main supply of the driver, which is provided into the driver 112. The first FET 208 is configured to operate as the inverter 126 while the second FET 210 operates as a source follower used by the inverter 126.

The use of the inverter 126 provided by first FET 208 and source follower of second FET 210 shown causes the drain supply voltage of the driver to vary in the opposite direction of the final drain supply voltage. If both stages of the module have similar gain and phase characteristics, then the opposing varying supply voltages cancel the variations caused in the amplifier 106 by the power supply modulator 120. As shown, the inverter circuit 200 provides the correct transfer function for the module 100. It also provides a flat gain and group delay across the bandwidth of the envelope signal, which can be equal to twice the bandwidth of the RF signal that is passing through the module 100. Thus, the inverter module 200 provides an inverted modulated supply to the driver 112 so that a predistorted signal is provided to the power amplifier 106 thereby cancelling the distortions caused by the power supply modulator 120.

Figure 3:
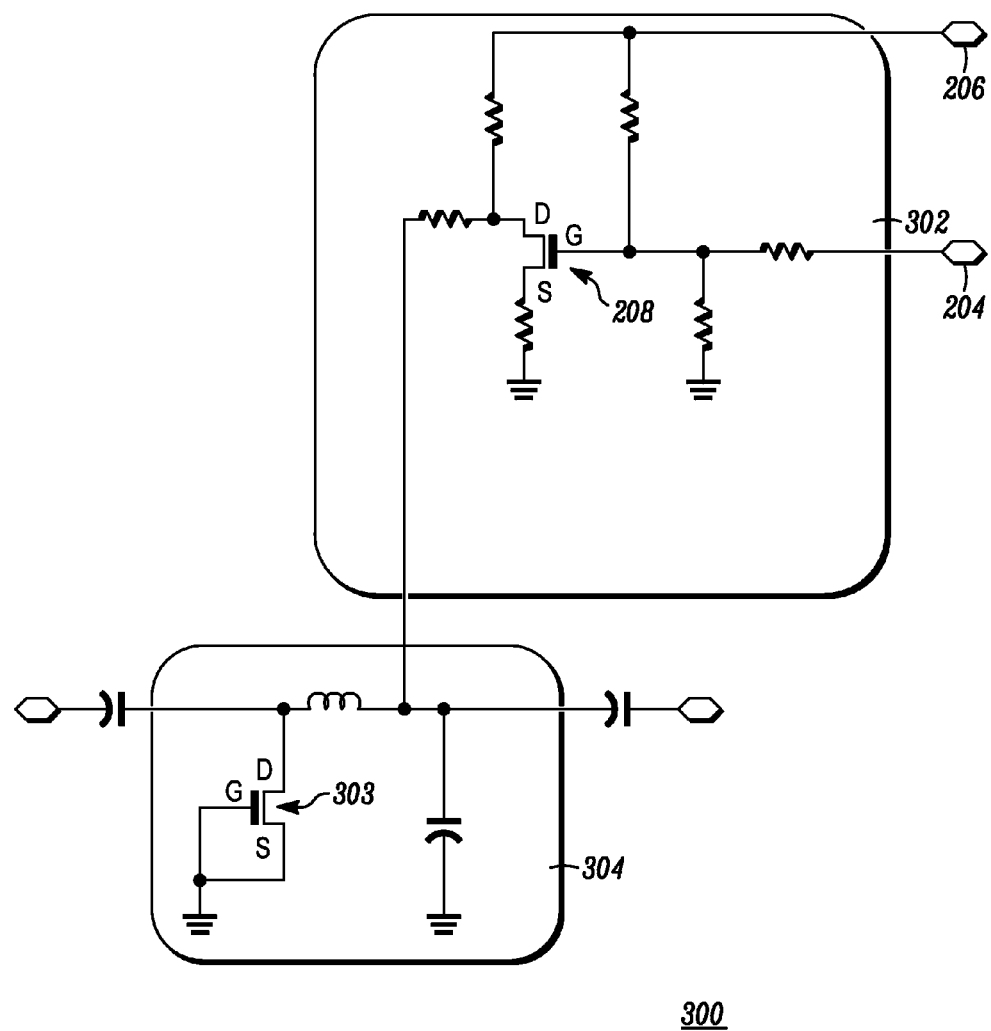
FIG. 3 is an alternative illustration of the inverter circuit used in accordance with some embodiments of the invention.

FIG. 3 illustrates an alternative embodiment of the inverter module 200. It is determined that performance can be maintained by removing the source follower. In addition, a voltage variable phase shifter can be used in conjunction with the inverter. As seen, module 300 provides an FET 303 that operates as the voltage variable phase shifter 304. The voltage variable phase shifter 304 can be configured to proceed the driver 112 or to be in series between the driver 112 and the power amplifier 106. Using a voltage variable phase shifter 304 as a part of the module 300 avoids a floating FET break down problem that can arise in conjunction with FET 210 in module 200. The module 300 includes inverter module 302 that only includes first FET 208 that serves as the inverter circuit. As is understood, various other components such as resistors and capacitors are configured to optimize the performance of the inverter 300.

Figure 4:
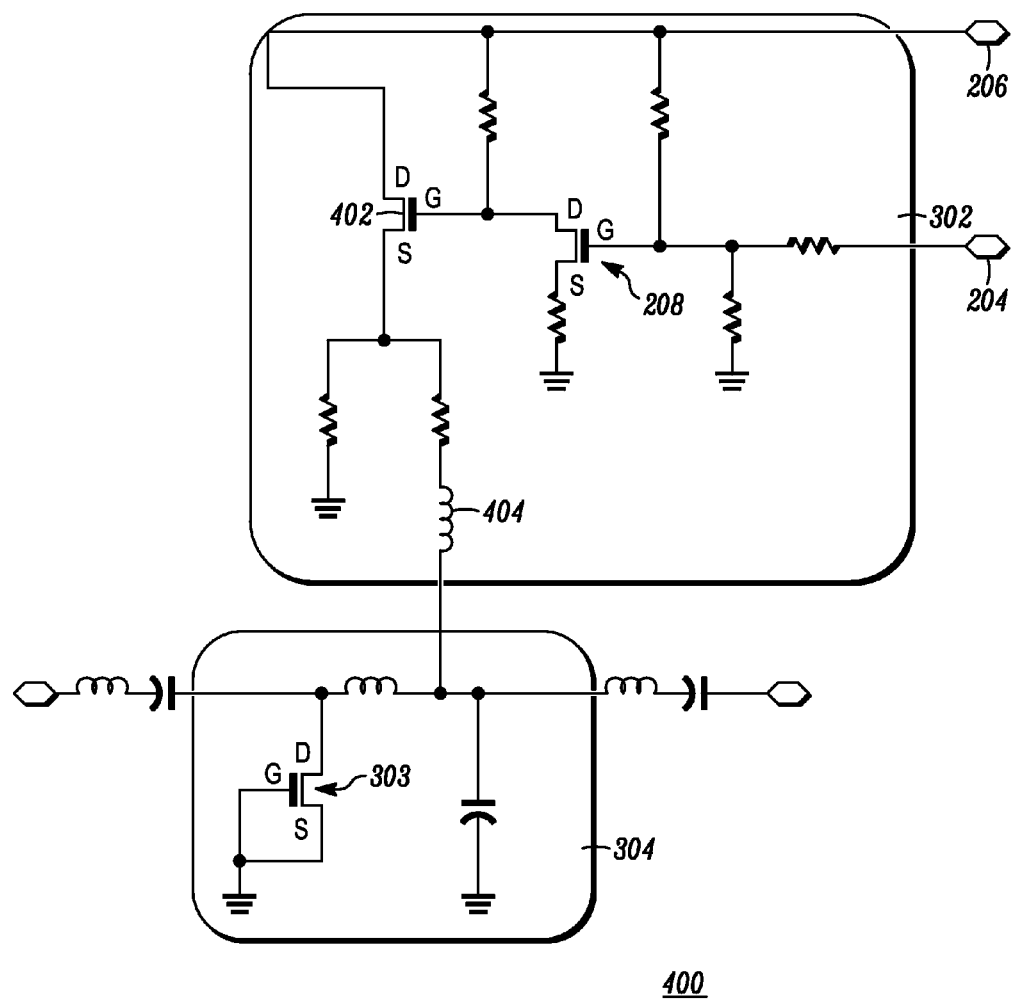
FIG. 4 is another alternative illustration of the inverter circuit used in accordance with some embodiments of the invention.

In order to reduce delay that can be caused by the high impedance found at the drain of the first FET 208, FIG. 4 illustrates another alternative embodiment 400 for the inverter 200. FET 402 is introduced to inverter module 302 as a source follower. The source follower 402 reduces the resistive component found at the drain of FET 208 and is used to improve performance. In addition, a choke 404 is added to the inverter module 304. This allows the resistor components to be reduced in value without dramatically increasing insertion loss and decouples the resistor from the bias component. This combination results in more than a 10× drop of total resistance at the source. The bias resistance and gain resistance can also be adjusted to keep the FET 402 source voltage below the source-body breakdown voltage while maintaining an acceptable phase shift across the range of the input voltage. Further variations of the impedance and capacitance in the embodiment 400 can be made depending on the frequency band for the module 100.

Further modifications to the configuration of the module 100 can be used depending the frequency range and IC process variations. For example a single ended inverter circuit can be replaced by a differential amplifier inverter. In addition, if there are multiple amplifier stages, the modifications using the inverter can be applied to the first stage in order to improve overall efficiency and reduce the supply voltages. This would reduce the source-body breakdown problems that may arise at the source follower FET.

ICs using the embodiments described show that the distortions caused by the power supply modulator 120 can be significantly reduced. An embodiment that supports full inversion modulation is expected to nearly eliminate the induced distortion. This allows the power supply modulator output 124 to swing over a wider voltage range, thus further improving the PA efficiency. By providing the module on the IC, as described, the use of an inverter can significantly reduce costs of the amplifier stages. Moreover, the principles described can work for power amplifiers regardless of frequency range or bandwidth requirements.

Figure 5:
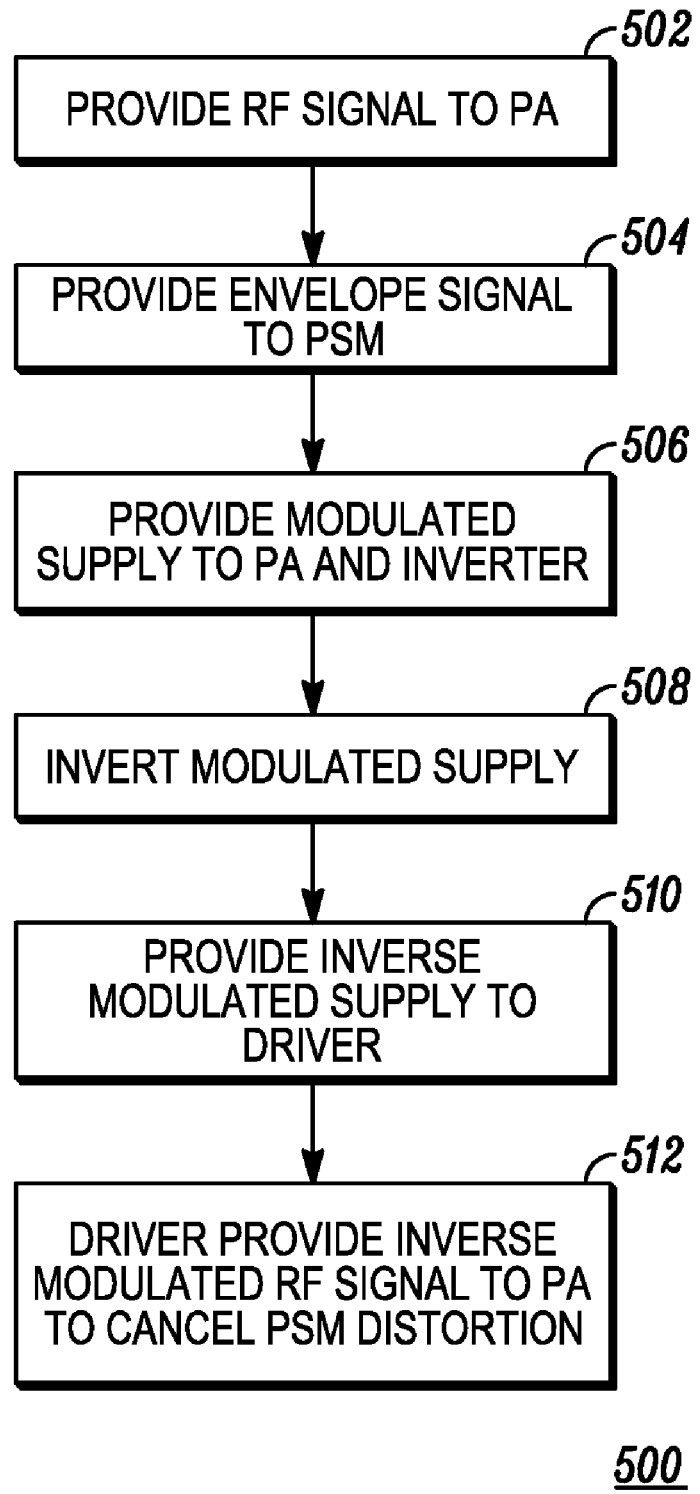
FIG. 5 is a flow chart illustrating a method of use for a power amplifier module in accordance with some embodiments of the invention.

FIG. 5 illustrates a flow chart of a method 500 of removing the distortion caused by a power supply modulator in a power amplifier IC. The method includes providing 502 a radio frequency signal to the power amplifier module 100. In particular the radio frequency signal can be supplied to the driver of the module and therefore to the power amplifier 106. An envelope signal is provided 504 to the power supply modulator 120 of the module 100. This signal can be provided using the envelope of the radio frequency signal. The power supply modulator then provides 506 the modulated supply to power amplifier 106 and to the inverter 126. The inverter then inverts 508 the modulated supply to therefore provide 510 an inverse modulated supply to the driver 112. The driver 112 provides 512 the inverse modulated RF signal to the power amplifier 106 to therefore cancel the distortion in the power amplifier caused by the modulated supply provided to the amplifier 106.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. An apparatus comprising:
a power amplifier;
a power supply modulator coupled to the power amplifier, and
an inverter coupled between the power amplifier and the power supply modulator wherein the inverter provides a predistorted signal wherein the predistorted signal includes an inverted power supply signal and wherein the predistorted signal is provided to the power amplifier to cancel distortion in the power amplifier caused by the power supply modulator.

2. The apparatus of claim 1 further comprising a driver coupled between the power amplifier and the inverter wherein the driver supplies the predistorted signal to the power amplifier by the inverter providing an inverse modulated supply to the driver.

3. The apparatus of claim 2 comprising a radio frequency signal provided to the driver as an input signal to the apparatus.

4. The apparatus of claim 1 wherein the power supply modulator provides a modulated supply to the power amplifier and the inverter.

5. The apparatus of claim 4 wherein an envelope signal is input into the power supply modulator so that the power supply modulator provides the modulated supply to the power amplifier and the inverter.

6. The apparatus of claim 1 wherein the predistorted signal cancels phase and gain variations caused by the modulated supply to the power amplifier.

7. The apparatus of claim 1 wherein the power amplifier and the inverter are supplied on an integrated circuit.

8. The apparatus of claim 7 wherein a driver is supplied on the integrated circuit.

9. The apparatus of claim 7 wherein the integrated circuit is a lateral diffused MOSFET (LDMOS) integrated circuit.

10. A method comprising:
providing a radio frequency signal to a power amplifier;
providing a modulated supply to power amplifier
inverting the modulated supply to provide a predistorted signal wherein the predistorted signal includes an inverted power supply signal, and providing the predistorted signal to the power amplifier to cancel distortion in the power amplifier caused by the power supply modulator.

11. The method of claim 10 wherein the radio frequency signal and the inverted modulated supply is supplied to a driver so that the driver supplies the predistorted signal to the power amplifier.

12. The method of claim 10 wherein providing a modulated supply comprises supplying a signal envelope to a power supply modulator.

13. The method of claim 12 wherein the power supply modulator is supplying the modulated supply to the power amplifier and an inverter.

14. The method of claim 10 further comprising canceling phase and gain variations caused by the modulated supply signal to the power amplifier.

15. The method of claim 10 further comprising providing the power amplifier and an inverter are supplied on an integrated circuit.

16. The method of claim 15 further comprising providing a driver on the integrated circuit.

17. The method of claim 15 wherein the integrated circuit is a lateral diffused MOSFET (LDMOS) IC.

* * * * *